(12) United States Patent
Chen et al.

(10) Patent No.: US 9,190,521 B2
(45) Date of Patent: *Nov. 17, 2015

(54) POSITIVE PHOTOSENSITIVE RESIN COMPOSITION AND USES THEREOF

(71) Applicant: CHI MEI CORPORATION, Tainan (TW)

(72) Inventors: Kai-Min Chen, Tainan (TW); Chun-An Shih, Tainan (TW)

(73) Assignee: CHI MEI CORPORATION, Tainan (TW)

( * ) Notice: Subject to any disclaimer, the term of this patent is extended or adjusted under 35 U.S.C. 154(b) by 87 days.

This patent is subject to a terminal disclaimer.

(21) Appl. No.: 13/890,916

(22) Filed: May 9, 2013

(65) Prior Publication Data

US 2013/0306970 A1 Nov. 21, 2013

(30) Foreign Application Priority Data

May 16, 2012 (TW) .............................. 101117459 A

(51) Int. Cl.

| | | |
|---|---|---|
| *G03F 7/023* | (2006.01) | |
| *G03F 7/38* | (2006.01) | |
| *C08G 8/24* | (2006.01) | |
| *H01L 29/786* | (2006.01) | |
| *G03F 7/008* | (2006.01) | |
| *G03F 7/20* | (2006.01) | |
| *H01L 21/02* | (2006.01) | |
| *G03F 7/022* | (2006.01) | |
| *H01L 27/12* | (2006.01) | |

(52) U.S. Cl.
CPC ................ *H01L 29/786* (2013.01); *C08G 8/24* (2013.01); *G03F 7/0085* (2013.01); *G03F 7/0226* (2013.01); *G03F 7/0236* (2013.01); *G03F 7/20* (2013.01); *H01L 21/02107* (2013.01); *G03F 7/38* (2013.01); *H01L 27/1288* (2013.01)

(58) Field of Classification Search
CPC ....... G03F 7/0236; G03F 7/38; G03F 7/0226; C08G 8/24

USPC ............. 430/18, 165, 191, 192, 193; 528/155
See application file for complete search history.

(56) References Cited

U.S. PATENT DOCUMENTS

| | | | | |
|---|---|---|---|---|
| 5,151,339 A | * | 9/1992 | Sarubbi | ........................ 430/192 |
| 5,346,799 A | * | 9/1994 | Jeffries et al. | ................. 430/192 |
| 6,929,890 B2 | * | 8/2005 | Miyoshi | ............... G03F 7/0007 430/191 |
| 7,638,253 B2 | * | 12/2009 | Park et al. | ...................... 430/170 |
| 8,921,019 B2 | * | 12/2014 | Kwon et al. | ..................... 430/18 |
| 2007/0287086 A1 | | 12/2007 | Shinada et al. | |
| 2008/0254634 A1 | | 10/2008 | Park et al. | |
| 2010/0271578 A1 | | 10/2010 | Ohkuma et al. | |
| 2013/0164461 A1 | * | 6/2013 | Chen et al. | ..................... 428/1.6 |

FOREIGN PATENT DOCUMENTS

| | | |
|---|---|---|
| CN | 101295135 A | 10/2008 |
| CN | 101872122 A | 10/2010 |
| JP | 1999-143067 | 5/1999 |
| TW | 200811594 | 3/2008 |
| TW | 201216003 | 4/2012 |

OTHER PUBLICATIONS

Office Action issued on Jan. 21, 2014 by TIPO for the corresponding TW Patent Application No. 101117459 cites TW 201216003 A1 and TW 200811594 A.
English Abstract of TW 201216003 A1.
US 20070287086A1 corresponds to TW 200811594 A.
Office Action issued on Feb. 27, 2015 for the corresponding Chinese Patent Application No. 201310163929.1.
Search Report issued on Feb. 27, 2015 for the corresponding Chinese Patent Application No. 201310163929.1.
English translation of the Search Report issued on Feb. 27, 2015 for the corresponding Chinese Patent Application No. 201310163929.1.
CN 101295135 corresponds to US 2008254634.
CN 101872122 corresponds to US 2010271578.

\* cited by examiner

*Primary Examiner* — John S Chu
(74) *Attorney, Agent, or Firm* — WPAT, P.C.; Anthony King

(57) ABSTRACT

The invention relates to a positive photosensitive resin composition without color off after etching. The invention also provides a method for manufacturing a thin-film transistor array substrate, a thin-film transistor array substrate and a liquid crystal display device.

17 Claims, 1 Drawing Sheet

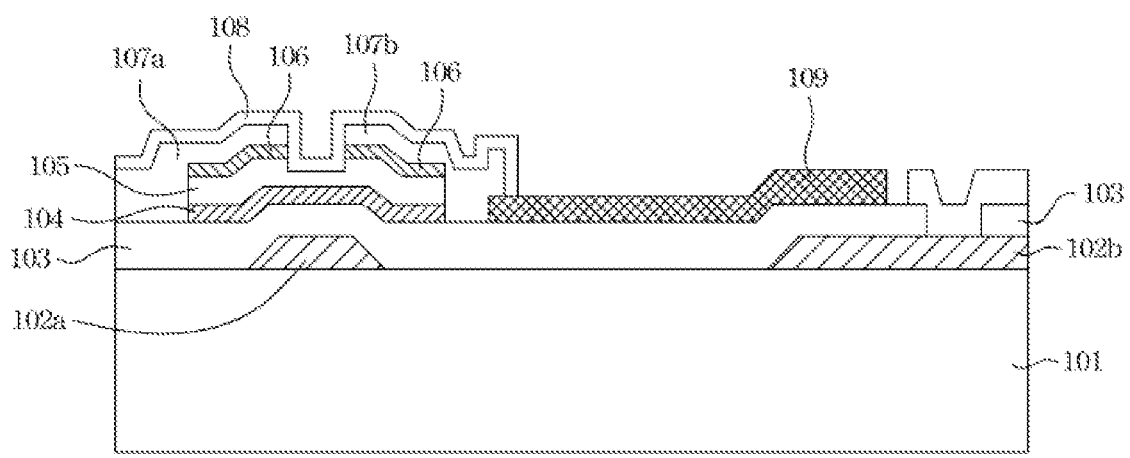

POSITIVE PHOTOSENSITIVE RESIN COMPOSITION AND USES THEREOF

BACKGROUND OF THE INVENTION

1. Field of the Invention

The invention relates to a positive photosensitive resin composition. Particularly, the invention relates to a positive photosensitive resin composition without color off after etching and uses thereof.

2. Description of the Related Art

With the light and thin trend in a variety of electronic products, a variety of smart phones, flat-screen TVs, and high-performance microprocessors has been widely used, and the optical lithography applied therein is more and more sophisticated, and the linewidth is also finer and finer.

For these purposes, Japanese Patent Publication No. 11-143067 discloses a positive photosensitive composition. The composition comprises a novolac resin, a dye for absorbing the ultraviolet, a photoacid initiator, and a crosslinking agent catalyzed by an acid. This patent uses a deuterium substituted dimethyl sulfoxide solution for the synthesis of the novolac resin to enhance the sensitivity and chemical resistance.

However, in the aforementioned conventional technique, the metal line and photoresist pattern attached thereon have the problems of the insufficient light shielding rate or color off after etching. Furthermore, because of the insufficient light shielding rate or color off, the photoresist cannot shield the reflect light of the metal lines. Especially in the manufacture process of the semiconductor integrated circuit components, thin-film transistor of the liquid crystal display element or touch panel, the resolution of the lithography process is reduced.

Accordingly, it is necessary to provide a positive photosensitive resin composition without color off to overcome the defects of the conventional positive photosensitive resin composition.

SUMMARY OF THE INVENTION

The invention relates to a positive photosensitive resin composition and a method for forming a pattern, especially to a positive photosensitive resin composition and a method for forming a pattern able to forming a fine pattern on a metal lines in the manufacture process of the semiconductor integrated circuit components, thin-film transistor of the liquid crystal display element or touch panel, and the pattern shows color without color off after etching, and benefit to shield the reflect light of the metal lines.

Therefore, the invention relates to a positive photosensitive resin composition comprising:
  a novolac resin (A);
  an ortho-naphthoquinone diazide sulfonic acid ester (B);
  a dye (C); and
  a solvent (D);
  wherein the novolac resin (A) is obtained by polycondensing a cresol aromatic hydroxyl compound with an aldehyde; based on 100% of the integral area of the molecular weight of the novolac resin (A) measured by the gel permeation chromatography, the area of the cresol dimer in the novolac resin (A) ranges from 0.5% to 6%; the dye (C) comprises a dye (C-1) and a dye (C-2), and the dye (C-1) is selected from the group consisting of a disazo dye, an anthraquinone dye, and a trivalent chromium azo dye; and the dye (C-2) is a triarylmethane dye.

The present invention also provides a method for manufacturing a thin-film transistor array substrate. The thin-film transistor array substrate comprises a substrate and a pattern. The method comprises coating the positive photosensitive resin composition as mentioned above on the substrate to form the pattern.

The present invention also provides a thin-film transistor array substrate manufactured according to the method as mentioned above.

The present invention also provides a liquid crystal display device comprising the thin-film transistor array substrate as mentioned above.

BRIEF DESCRIPTION OF THE DRAWINGS

FIG. 1 is a partial cross-sectional diagram of a TFT array substrate for a LCD device according to the present invention.

DETAILED DESCRIPTION OF THE INVENTION

The invention relates to a positive photosensitive resin composition comprising:
  a novolac resin (A);
  an ortho-naphthoquinone diazide sulfonic acid ester (B);
  a dye (C); and
  a solvent (D);
  wherein the novolac resin (A) is obtained by polycondensing a cresol aromatic hydroxyl compound with an aldehyde; based on 100% of the integral area of the molecular weight of the novolac resin (A) measured by the gel permeation chromatography, the area of the cresol dimer in the novolac resin (A) ranges from 0.5% to 6%; the dye (C) comprises a dye (C-1) and a dye (C-2), and the dye (C-1) is selected from the group consisting of a disazo dye, an anthraquinone dye, and a trivalent chromium azo dye; and the dye (C-2) is a triarylmethane dye.

The novolac resin (A) according to the invention refers to a resin typically obtained by polycondensing a cresol aromatic hydroxyl compound with an aldehyde.

Examples of the cresol aromatic hydroxyl compound include but are not limited to cresols such as m-cresol, p-cresol, o-cresol and the like; xylenols such as 2,3-dimethylphenol, 2,5-dimethylphenol, 3,5-dimethylphenol, 3,4-dimethylphenol and the like. The aforementioned cresol aromatic hydroxyl compounds may be used alone or in combinations of two or more.

In the condition without affecting the physical properties of the positive photosensitive resin composition, the novolac resin (A) according to the invention can also obtained by polycondensing an other aromatic hydroxyl compound with an aldehyde.

Examples of the other aromatic hydroxyl compound include but are not limited to phenol; alkyl phenols such as m-ethylphenol, p-ethylphenol, o-ethylphenol, 2,3,5-trimethylphenol, 2,3,5-triethylphenol, 4-tert-butylphenol, 3-tert-butylphenol, 2-tert-butylphenol, 2-tert-butyl-4-cresol, 2-tert-butyl-5-cresol, 6-tert-butyl-3-cresol and the like; alkoxy phenols such as p-methoxyphenol, m-methoxyphenol, p-ethoxyphenol, m-ethoxyphenol, p-propoxyphenol, m-propoxyphenol and the like; isopropenyl phenols such as o-isopropenyl phenol, p-isopropenyl phenol, 2-methyl-4-isopropenyl phenol, 2-ethyl-4-isopropenyl phenol and the like; aryl phenols such as phenyl phenol; and polyhydroxyphenols such as 4,4'-dihydroxybiphenyl, bisphenol A, resorcinol, hydroquinone, pyrogallol and the like.

Examples of the aforementioned aldehyde that is suitable to polycondense with the cresol aromatic hydroxyl compound include but are not limited to formaldehyde, paraformaldehyde, trioxane, acetaldehyde, propanal, butanal, trimethyl acetaldehyde, acrolein, crotonaldehyde, cyclohexanealdehyde, furfural, furylacrolein, benzaldehyde, terephthal aldehyde, phenylacetaldehyde, α-phenylpropanal, β-phenylpropanal, o-hydroxybenzaldehyde, m-hydroxybenzaldehyde, p-hydroxybenzaldehyde, o-methylbenzaldehyde, m-methylbenzaldehyde, p-methylbenzaldehyde, o-chlorobenzaldehyde, m-chlorobenzaldehyde, p-chlorobenzaldehyde, cinnamaldehyde and the like. The aforementioned aldehydes may be used alone or in combinations of two or more. Among those aldehydes, formaldehyde is preferred.

Preferably, the novolac resin (A) is polycondensed in the presence of a catalyst of a conventional organic acid and/or inorganic acid (such as hydrochloric acid, sulfuric acid, formic acid, acetic acid, oxalic acid, p-toluenesulfonic) under the normal pressure followed by dehydration, and removal of unreactive monomers.

The cresol dimer as used herein refers to a compound forming by m-m, o-o, or p-p linking the two m/p/o cresol monomers through the methylene groups.

In one embodiment of the invention, the content of the cresol dimer is controlled by fractionation or vacuum distillation. One embodiment of the fractionation comprises dissolving the synthesized novolac resin in a good solvent, and then placing it in a poor solvent, so that the novolac resin is obtained by precipitation. In addition, the vacuum distillation comprises synthesizing the novolac resin at more than 230° C., preferably more than 250° C. under the pressure below 1.3 kPa.

Based on 100% of the integral area of the molecular weight of the novolac resin (A) according to the invention measured by the gel permeation chromatography, the area of the cresol dimer in the novolac resin (A) ranges from 0.5% to 6%; preferably from 0.5% to 5.5%; more preferably from 0.5% to 5.0%. If the area of the cresol dimer is less than 0.5%, the process cost is too high; if the area of the cresol dimmer is more than 6%, the color off after etching and poor resolution occurs. Without intending to be limited by theory, it is believed that if the content of the low molecular weight cresol dimer is too high, the dye is not easily coated. Moreover, the cresol dimer is easily dissolved in the alkaline developer, and the dye is dissolved away to lead the color off and then to the poor resolution.

The measurement of the molecular weight of the novolac resin (A) according to the invention is not limited. In one embodiment of the invention, the molecular weight of the novolac resin (A) is calculated from an integral molecular weight distribution curve obtained by plotting cumulative weight percentage versus molecular weight falling within a range between 200 and 150,000 measured by gel permeation chromatography; and the measurement condition for the gel permeation chromatography uses an apparatus of 717 plus which is manufactured by Waters®, columns of 79911GP-501, 79911GP-502, 79911GP-503, and 79911GP-504 which is manufactured by Agilent Technologies®, a detector of 2414 RI Detector which is manufactured by Waters®, a mobile phase of tetrahydrofuran, a flow rate of 1.0 ml/min, a injection volume of 100 μL, a measurement temperature of 40° C., a measurement period of 60 minutes, and a molecular weight standard of polystyrene.

As used herein, the ortho-naphthoquinone diazide sulfonic acid ester (B) can use the ones that are used widely in the prior art but have no specific limitation. Preferably, the ortho-naphthoquinone diazide sulfonic acid ester (B) can be an ester of an ortho-naphthoquinone diazide sulfonic acid and a hydroxy compound, in which the ortho-naphthoquinone diazide sulfonic acid is exemplified as ortho-naphthoquinone diazide-4-sulfonic acid, ortho-naphthoquinone diazide-5-sulfonic acid and ortho-naphthoquinone diazide-6-sulfonic acid. More preferably, the ortho-naphthoquinone diazide sulfonic acid ester (B) can be an ester of the ortho-naphthoquinone diazide sulfonic acid and a polyhydroxy compound. The aforementioned esters can be completely or partially esterified. Examples of the hydroxy compound can be (1) hydroxybenzophenones; (2) hydroxyaromatic compounds of formula (13); (3) (hydroxyphenyl)hydrocarbons of formula (14); (4) other aromatic hydroxy compounds and the like and illustrated as bellows.

(1) Hydroxybenzophenones are exemplified as 2,3,4-trihydroxybenzophenone, 2,4,4'-trihydroxybenzophenone, 2,4,6-trihydroxybenzophenone, 2,3,4,4'-tetrahydroxybenzophenone, 2,2',4,4'-tetrahydroxybenzophenone, 2,3',4,4',6-pentahydroxybenzophenone, 2,2',3,4,4'-pentahydroxybenzophenone, 2,2',3,4,5'-pentahydroxybenzophenone, 2,3',4,5,5'-pentahydroxybenzophenone, 2,3,3',4,4',5'-hexahydroxybenzophenone and the like.

(2) Hydroxyaromatic compounds are exemplified as the following formula (13):

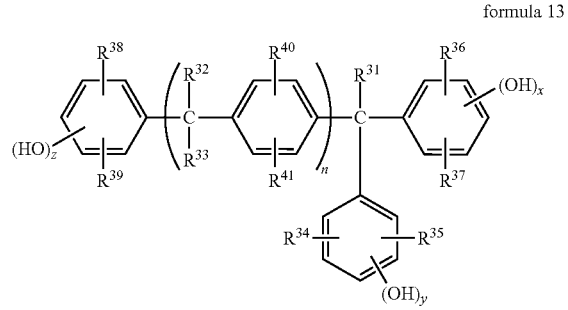

formula 13 wherein:
$R^{31}$, $R^{32}$ and $R^{33}$ represent a hydrogen atom or a $C_1$ to $C_6$ alkyl group;
$R^{34}$, $R^{35}$, $R^{36}$, $R^{37}$, $R^{38}$ and $R^{39}$ represent a hydrogen atom, a halogen atom, a $C_1$ to $C_6$ alkyl group, a $C_1$ to $C_6$ alkoxy group, a $C_1$ to $C_6$ alkenyl group or a cycloalkyl group;
$R^{40}$ and $R^{41}$ represent a hydrogen atom, a halogen atom, or a $C_1$ to $C_6$ alkyl group;
x, y and z independently represent an integer of 1 to 3; and
n represent an integer of 0 to 1.

Specific examples of the hydroxyaromatic compound of the formula (13) include but are not limited to tris(4-hydroxyphenyl)methane, bis(4-hydroxy-3,5-dimethylphenyl)-4-hydroxyphenyl methane, bis(4-hydroxy-3,5-dimethylphenyl)-3-hydroxyphenyl methane, bis(4-hydroxy-3,5-dimethylphenyl)-2-hydroxyphenyl methane, bis(4-hydroxy-2,5-dimethylphenyl)-4-hydroxyphenyl methane, bis(4-hydroxy-2,5-dimethylphenyl)-3-hydroxyphenyl methane, bis(4-hydroxy-2,5-dimethylphenyl)-2-hydroxyphenyl methane, bis(4-hydroxy-3,5-dimethylphenyl)-3,4-dihydroxyphenyl methane, bis(4-hydroxy-2,5-dimethylphenyl)-3,4-dihydroxyphenyl methane, bis(4-hydroxy-3,5-dimethylphenyl)-2,4-dihydroxyphenyl methane, bis(4-hydroxy-2,5-dimethylphenyl)-2,4-dihydroxyphenyl methane, bis(4-hydroxyphenyl)-3-methoxy-4-hydroxyphenyl methane, bis (3-cyclohexyl-4-hydroxyphenyl)-3-hydroxyphenyl methane, bis(3-cyclohexyl-4-hydroxyphenyl)-2-hydroxyphenyl methane, bis(3-cyclohexyl-4-hydroxyphenyl)-4-hydroxyphenyl methane, bis(3-cyclohexyl-4-hydroxy-6-methylphenyl)-2-hydroxyphenyl methane, bis(3-cyclohexyl-4-hydroxy-6-methylphenyl)-3-hydroxyphenyl methane, bis(3-cyclohexyl-4-hydroxy-6-methylphenyl)-4-hydroxyphenyl methane, bis(3-cyclohexyl-4-hydroxy-6-methylphenyl)-3,4-dihydroxyphenyl methane, bis(3-cyclohexyl-6-hydroxyphenyl)-3-hydroxyphenyl methane, bis(3-cyclohexyl-6-hydroxyphenyl)-4-hydroxyphenyl methane, bis(3-cyclohexyl-6-hydroxyphenyl)-2-hydroxyphenyl methane, bis(3-cyclohexyl-6-hydroxy-4-methylphenyl)-2-hydroxyphenyl methane, bis(3-cyclohexyl-6-hydroxy-4-methylphenyl)-4-hydroxyphenyl methane, bis(3-cyclohexyl-6-hydroxy-4-methylphenyl)-3,4-dihydroxyphenyl methane, 1-[1-(4-hydroxylphenyl)isopropyl]-4-[1,1-bis(4-hydroxylphenyl) ethyl]benzene, 1-[1-(3-methyl-4-hydroxylphenyl)isopropyl]-4-[1,1-bis(3-methyl-4-hydroxylphenyl)ethyl]benzene.

(3) (Hydroxyphenyl)hydrocarbons are exemplified as the following formula (14):

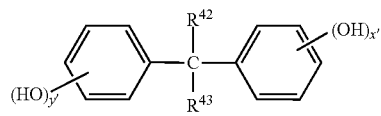

formula 14 wherein:
$R^{42}$ and $R^{43}$ represent a hydrogen atom or a $C_1$ to $C_6$ alkyl group; and
x' and y' independently represent an integer of 1 to 3.

Specific examples of the (hydroxyphenyl)hydrocarbon of the formula (14) include but are not limited to 2-(2,3,4-trihydroxyphenyl)-2-(2',3',4'-trihydroxyphenyl)propane, 2-(2,4-dihydroxyphenyl)-2-(2',4'-dihydroxyphenyl)propane, 2-(4-hydroxyphenyl)-2-(4'-hydroxyphenyl)propane, bis(2,3,4-trihydroxyphenyl)methane, bis(2,4-dihydroxyphenyl)methane and the like.

(4) Other aromatic hydroxy compounds are exemplified as phenol, p-methoxy phenol, dimethyl phenol, hydroquinone, bisphenol A, naphthol, pyrocatechol, 1,2,3-pyrogallol monomethyl ether, 1,2,3-pyrogallol-1,3-dimethyl ether, 3,4,5-trihydroxybenzoic acid (gallic acid), partially esterified or partially etherified gallic acid and the like.

Among those hydroxy compounds, 2,3,4-trihydroxybenzophenone and 2,3,4,4'-tetrahydroxybenzophenone are preferable. The aforementioned hydroxy compounds may be used alone or in combinations of two or more.

The ortho-naphthoquinone diazide sulfonic acid ester (B) in the positive photosensitive resin composition according to the present can use a quinone diazide compound such as ortho-naphthoquinone diazide-4-(or -5-) sulfonyl halide salt, followed by condensation with (1) to (4) of the hydroxy compounds to achieve complete or partial esterification. The aforementioned condensation is usually carried out in an organic solvent such as dioxane, N-pyrrolidone, acetamide or the like. Simultaneously, the condensation is more advantageously carried out in the presence of an alkaline condensing agent such as triethanolamine, alkali metal carbonate or alkali metal bicarbonate or the like.

Based on 100 mole percents of the total hydroxy group of the hydroxy compound, esterification of the ortho-naphthoquinone diazide-4-(or -5-)sulfonyl halide salt is preferably condensed with 50 mole percents of hydroxy group the hydroxy compound, and more preferably condensed with 60 mole percents of hydroxy group the hydroxy compound. In other word, the esterification degree is equal to or more than 50 percents, and more preferably more than 60 percents.

In one preferred embodiment of the invention, the amount of the ortho-naphthoquinone diazide sulfonic acid ester (B) used is from 1 to 100 parts by weight; preferably from 5 to 50 parts by weight; more preferably from 10 to 40 parts by weight; still more preferably from 20 to 30 parts by weight based on 100 parts by weight of the novolac resin (A).

The dye (C) according to the invention comprises a dye (C-1) and a dye (C-2), and the dye (C-1) is selected from the group consisting of a disazo dye, an anthraquinone dye, and a trivalent chromium azo dye; and the dye (C-2) is a triarylmethane dye. If the dye (C-1) or the dye (C-2) is absent, the resolution and the film remaining rate is not satisfactory.

The disazo dye according to the invention can be chosen by artisans skilled in this field. Several commercialized products of the disazo dye are ready for chosen, such as C.I. Acid Black 1, C.I. Acid Black 24, C.I. Reactive Black 5, C.I. Solvent Black 3 (trade name of Sudan Black 141; manufactured by Chuo synthetic Chemical Co, trade name of Neptun Black X60; manufactured by BASF), and Oil Black DA-41 manufactured by NEMOTO & CO., LTD.

The anthraquinone dye according to the invention can be chosen by artisans skilled in this field. Several commercialized products of the anthraquinone dye are ready for chosen, such as C.I. Solvent Red 52, C.I. Solvent Red 111, C.I. Solvent Red 149, C.I. Solvent Red 150, C.I. Solvent Red 151, C.I. Solvent Red 168, C.I. Solvent Red 191, C.I. Solvent Red 207, C.I. Solvent Blue 35, C.I. Solvent Blue 36, C.I. Solvent Blue 63, C.I. Solvent Blue 78, C.I. Solvent Blue 83, C.I. Solvent Blue 87, C.I. Solvent Blue 94, C.I. Solvent Blue 97, C.I. Solvent Blue 101, C.I. Solvent Green 3, C.I. Solvent Green 20, C.I. Solvent Green 28, C.I. Solvent Violet 13, C.I. Solvent Violet 14, C.I. Solvent Violet 36, C.I. Disperse Red 22, C.I. Disperse Red 60, C.I. Disperse Violet 31, C.I. Disperse Violet 28, C.I. Vat Black 27, and Kayaset Black A-N manufactured by Nippon Kayaku CO., LTD.

The trivalent chromium azo dye according to the invention can be chosen by artisans skilled in this field. Several commercialized products of the trivalent chromium azo dye are ready for chosen, such as Solvent Black 27 (trade name of Neozapon Black X51; manufactured by BASF, trade name of Van CHAKU Black Z1-1500; manufactured by Gen Gen Corporation), Solvent Black 29 (trade name of VALIFAST BLACK 3808; manufactured by ORIENT CHEMICALS), C.I. Solvent Black 34 (trade name of VALIFAST BLACK 3804; manufactured by ORIENT CHEMICALS).

The aforementioned dye (C-1) may be used alone or in combinations of two or more.

The dye (C-2) according to the invention can be chosen by artisans skilled in this field. In one preferred embodiment of the invention, the dye (C-2) has a structure represented by the following general formula (1) or formula (2) or a salt thereof,

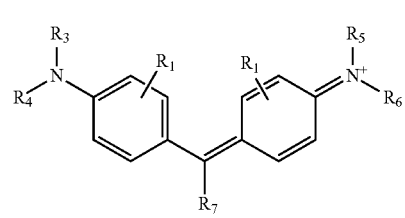

formula (1)

formula (2)

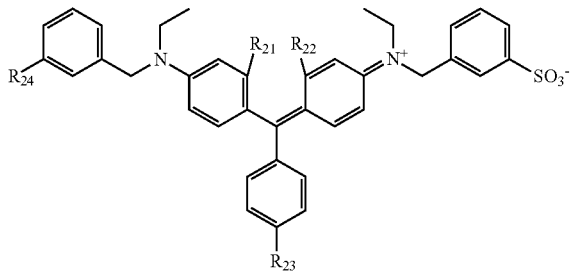

wherein in formula (1), $R_1$ and $R_2$ are independently selected from the group consisting of a hydrogen atom, a halogen atom and a $C_1$ to $C_5$ alkyl group;

$R_3$, $R_4$, $R_5$, and $R_6$ are independently selected from the group consisting of a hydrogen atom, a $C_1$ to $C_5$ alkyl group, a phenyl group and a benzyl group; and $R_7$ is selected from the group consisting of the general formula (3), formula (4) and formula (5), formula (3)

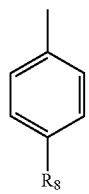

formula (4)

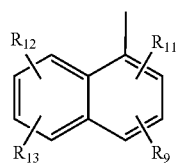

formula (5)

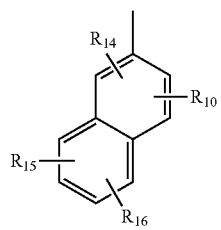

wherein:
$R_8$ to $R_{10}$ are selected from the group consisting of a hydrogen atom and $-NR_{25}R_{26}$;
  wherein:
    $R_{25}$ and $R_{26}$ are independently selected from the group consisting of a hydrogen atom, a $C_1$ to $C_5$ alkyl group, a benzyl group, a phenyl group, and a phenyl group substituted by a $C_1$ to $C_3$ alkoxy group or by a $C_1$ to $C_3$ alkyl group in the para position; and
$R_{11}$ to $R_{16}$ are independently selected from the group consisting of a hydrogen atom, a hydroxyl group and $-SO_3^-$;
wherein in formula (2),
$R_{21}$ and $R_{22}$ are independently selected from the group consisting of a hydrogen atom, a halogen atom, and a $C_1$ to $C_5$ alkyl group; and $R_{23}$ is selected from the group consisting of a hydrogen atom, $-SO_3^-$, a carboxyl group, a $C_1$ to $C_3$ alkyl group, a $C_1$ to $C_3$ alkoxyl group, and $-NR_{25}R_{26}$; and $R_{24}$ is selected from the group consisting of a hydrogen atom and $-SO_3^-$.

Preferably, the $C_1$ to $C_3$ alkyl group of the $R_8$, $R_{21}$, $R_{22}$, $R_{23}$, $R_{25}$ and $R_{26}$ is a methyl group, an ethyl group or a propyl group; the $C_1$ to $C_3$ alkoxy group of the $R_8$ and $R_{23}$ is a methoxy group, an ethoxy group or a propoxy group; the phenyl group substituted by a $C_1$ to $C_3$ alkoxy group in the para position of the $R_{25}$ and $R_{26}$ is a p-methoxyphenyl group, a p-ethoxyphenyl group, or a p-propoxyphenyl.

The triarylmethane dye (C-2) according to the invention can be a salt of the structure represented by the following general formula (1) or formula (2), such as an alkali metal salt of sodium, potassium, or the like; an amine salt of triethylamine of 2-ethylhexyl amine, 1-amino-3-diphenyl butane, or the like. The salt can also be a salt formed with $-SO_3^-$.

Several commercialized products of the triarylmethane dye (C-2) are ready for chosen, such as C. I. Acid Green 3, C. I. Acid Green 9, C. I. Acid Green 16, C. I. Acid Green 50, C. I. Acid Blue 7, C. I. Acid Blue 83 (trade name of Brilliant Blue R; manufactured by Trust Chem), C. I. Acid Blue 90, C. I. Acid Blue 108, C. I. Acid Violet 17 (trade name of Coomassie Violet R200; manufactured by Sigma), C. I. Acid Violet 49, C.I. Solvent Green 15, C.I. Solvent Violet 8, C.I. Basic Blue 1, C.I. Basic Blue 5, C.I. Basic Blue 7 (trade name of Basonyl Blau 636; manufactured by BASF), C.I. Basic Blue 8, C.I. Basic Blue 26, C. I. Solvent Blue 5, C. I. Solvent Blue 38, C.I. Basic Green 1, C.I. Basic Red 9, C.I. Basic Violet 3, C.I. Basic Violet 12, C.I. Basic Violet 14, Methyl Violet, Crystal Violet, Victoria Blue B, Oil Blue 613 (manufactured by ORIENT CHEMICALS), VALIFAST Blue 1621 (manufactured by ORIENT CHEMICALS), SBN Blue 701 (manufactured by Hodogaya Chemical Co., Ltd) and derivatives thereof.

The aforementioned triarylmethane dye (C-2) may be used alone or in combinations of two or more.

Preferably, the dye (C) further comprises a dye (C-3), and the dye (C-3) is a phthalocyanine dye. The phthalocyanine dye according to the invention is preferably represented by the following general formula (6), formula (6)

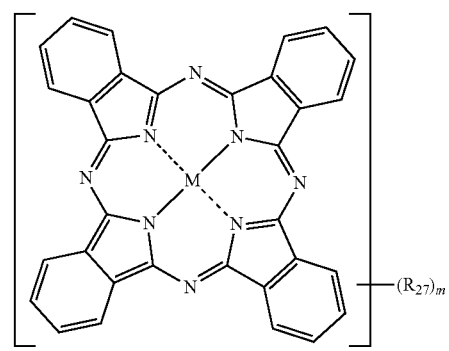

wherein:
$R_{27}$ represents a substituent, and preferably is a substituent represented by $R_{a1}$ to $R_{a8}$ and $R_{b1}$ to $R_{b8}$ in the following formula (7);
m represents an integer of 1 to 8; preferably 1 to 6; more preferably 1 to 4; when m is an integer larger than 2, the multiple $R_{27}$ can be the same of different; and M is selected from the group consisting of a metal, a metal chloride, a metal oxide and a metal hydroxide. Preferably, the metal is selected from the group consisting of zinc, magnesium, silicon, tin, rhodium, platinum, palladium, molybdenum, manganese, lead, copper, nickel, cobalt and iron; the metal chloride is selected from the group consisting of AlCl, InCl, FeCl, $TiCl_2$, $SnCl_2$, $SiCl_2$, and $GeCl_2$; the metal oxide is selected from the group consisting of TiO and VO; the metal hydroxide is $Si(OH)_2$; more preferably, M is selected from the group consisting of zinc, palladium, copper, nickel, cobalt, and VO; still more preferably, M is selected from the group consisting of zinc, copper, cobalt and VO; most preferably, M is copper.

In one embodiment of the invention, the phthalocyanine dye according to the invention is preferably represented by the following general formula (7), formula (7)

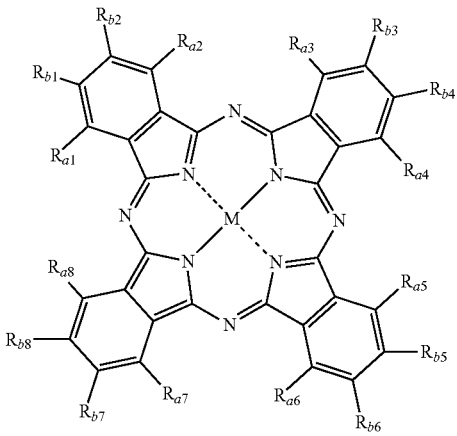

wherein:

$R_{a1}$ to $R_{a8}$ and $R_{b1}$ to $R_{b8}$ are respectively independently selected from the group consisting of a hydrogen atom, a halogen atom, a cyano group, a nitro group, a formyl group, a carboxyl group, a sulfo group, a substituted or unsubstituted $C_1$ to $C_{20}$ alkyl group, a substituted or unsubstituted $C_6$ to $C_{14}$ aryl group, a substituted or unsubstituted $C_1$ to $C_{10}$ heterocyclic group, a substituted or unsubstituted $C_1$ to $C_{20}$ alkoxy group, a substituted or unsubstituted $C_6$ to $C_{14}$ aryloxy group, a substituted or unsubstituted $C_2$ to $C_{21}$ acyl group, a substituted or unsubstituted $C_1$ to $C_{20}$ alkylsulfonyl group, a substituted or unsubstituted $C_6$ to $C_{14}$ arylsulfonyl group, a substituted or unsubstituted $C_1$ to $C_{10}$ heterysulfonyl group, a substituted or unsubstituted $C_1$ to $C_{25}$ carbamoyl group, a substituted or unsubstituted $C_0$ to $C_{32}$ sulfamoyl group, a substituted or unsubstituted $C_2$ to $C_{20}$ alkoxycarbonyl group, a substituted or unsubstituted $C_7$ to $C_{15}$ aryloxycarbonyl group, a substituted or unsubstituted $C_2$ to $C_{21}$ acylamino group, a substituted or unsubstituted $C_1$ to $C_{20}$ sulfonylamino group, and a substituted or unsubstituted $C_0$ to $C_{36}$ amino group;

wherein the amino group contains an anilino group. Furthermore, at least eight of the $R_{a1}$ to $R_{a8}$ and $R_{b1}$ to $R_{b8}$ are a hydrogen atom and $R_{a1}$ to $R_{a8}$ are not all a hydrogen atom to enhance the solubility to the solvent.

Preferably, $R_{a1}$ to $R_{a8}$ and $R_{b1}$ to $R_{b8}$ are respectively independently selected from the group consisting of a hydrogen atom, a halogen atom, a carboxyl group, a sulfo group, a substituted or unsubstituted $C_1$ to $C_{16}$ alkyl group (such as a methyl group, an ethyl group, a n-propyl group and an isopropyl group), a substituted or unsubstituted $C_6$ to $C_{14}$ aryl group (such as a phenyl group, a p-methoxyphenyl group, a p-octadecylphenyl group), a substituted or unsubstituted $C_1$ to $C_{16}$ alkoxy group (such as a methoxy group, an ethoxy group, a n-octyloxy group), a substituted or unsubstituted $C_6$ to $C_{10}$ aryloxy group (such as a phenoxy group, a p-ethoxyphenoxy), a substituted or unsubstituted $C_1$ to $C_{20}$ alkylsulfonyl group (such as a methyl sulfonyl group, an n-propyl sulfonyl group, an n-octyl sulfonyl group), a substituted or unsubstituted $C_6$ to $C_{14}$ arylsulfonyl group (such as a tolyl sulfonamide group, a phenyl sulfonamide group), a substituted or unsubstituted $C_0$ to $C_{20}$ sulfamoyl group (such as a methyl sulfamoyl group, an n-butyl sulfamoyl group), a substituted or unsubstituted $C_1$ to $C_{17}$ alkoxycarbonyl group (such as a methoxylcarbonyl group, an n-butoxylcarbonyl group), a substituted or unsubstituted $C_7$ to $C_{15}$ aryloxycarbonyl group (such as a phenoxycarbonyl group), a substituted or unsubstituted $C_2$ to $C_{21}$ acylamino group (such as an acetamino group, a trimethyl acetamino group), and a substituted or unsubstituted $C_1$ to $C_{18}$ sulfonylamino group (such as a methyl sulfonylamino group, an n-butylsulfonylamino group).

More preferably, $R_{a1}$ to $R_{a8}$ and $R_{b1}$ to $R_{b8}$ are respectively independently selected from the group consisting of a hydrogen atom, a halogen atom, a carboxyl group, a sulfo group, a substituted or unsubstituted $C_1$ to $C_{16}$ alkyl group, a substituted or unsubstituted $C_1$ to $C_{16}$ alkoxy group, a substituted or unsubstituted $C_1$ to $C_{20}$ alkylsulfonyl group, a substituted or unsubstituted $C_6$ to $C_{14}$ arylsulfonyl group, a substituted or unsubstituted $C_2$ to $C_{20}$ sulfamoyl group, a substituted or unsubstituted $C_1$ to $C_{13}$ alkoxycarbonyl group, a substituted or unsubstituted $C_2$ to $C_{21}$ acylamino group, and a substituted or unsubstituted $C_1$ to $C_{18}$ sulfonylamino group.

Still more preferably, $R_{a1}$ to $R_{a8}$ are respectively independently selected from the group consisting of a hydrogen atom, a halogen atom, a sulfo group, a substituted or unsubstituted $C_1$ to $C_{16}$ alkoxy group, a substituted or unsubstituted $C_1$ to $C_{20}$ alkylsulfonyl group, a substituted or unsubstituted $C_6$ to $C_{14}$ arylsulfonyl group, a substituted or unsubstituted $C_2$ to $C_{20}$ sulfamoyl group, a substituted or unsubstituted $C_2$ to $C_{21}$ acylamino group, and a substituted or unsubstituted $C_1$ to $C_{18}$ sulfonylamino group; $R_{b1}$ to $R_{b8}$ are a hydrogen atom or a halogen atom.

Most preferably, $R_{a1}$ to $R_{a8}$ are respectively independently selected from the group consisting of a hydrogen atom, a sulfo group, a substituted or unsubstituted $C_1$ to $C_{20}$ alkylsulfonyl group, a substituted or unsubstituted $C_6$ to $C_{14}$ arylsulfonyl group, and a substituted or unsubstituted $C_7$ to $C_{20}$ sulfamoyl group; $R_{b1}$ to $R_{b8}$ are a hydrogen atom.

Furthermore, any one of $R_{a1}$ and $R_{a2}$, any one of $R_{a3}$ and $R_{a4}$, any one of $R_{a5}$ and $R_{a6}$, and any one of $R_{a7}$ and $R_{a8}$ are preferably not all a hydrogen atom to enhance the solubility to the solvent.

When the groups represents by $R_{a1}$ to $R_{a8}$ and $R_{b1}$ to $R_{b8}$ are substituted, the substituents are exampled as follows.

A substituted or unsubstituted $C_1$ to $C_{20}$ linear or cyclic alkyl group (such as a methyl group, an ethyl group, an isopropyl group, a cyclohexyl group, a benzyl group, a phenethyl group), a substituted or unsubstituted $C_6$ to $C_{18}$ aryl group (such as a phenyl group, a chlorophenyl group, a 2,4-ditert-butylphenyl group, an 1-naphthyl group), a substituted or unsubstituted $C_2$ to $C_{20}$ alkenyl group (such as an ethenyl group, a 2-methylvinyl group), a substituted or unsubstituted $C_2$ to $C_{20}$ alkynyl group (such as an ethynyl group, a 2-methylethynyl group, a 2-phenylethynyl group), a halogen atom (such as a fluorine atom, a chlorine atom, a bromine atom, an iodine atom), a cyano group, a hydroxyl group, a carboxyl group, a substituted or unsubstituted $C_2$ to $C_{20}$ acyl group (such as an acetyl group, a benzoyl group, a salicylic acyl group, a trimethylacetyl group), a substituted or unsubstituted $C_1$ to $C_{20}$ alkoxyl group (such as a methoxy group, a butoxy group, a cyclohexyloxy group), a substituted or unsubstituted $C_6$ to $C_{20}$ aryloxy group (such as a phenoxy group, an 1-naphthyloxy group, a p-methoxy phenyl group), a substituted or unsubstituted $C_1$ to $C_{20}$ alkylthio group (such as a methylthio group, a butylthio group, a benzylthio group, a 3-methoxypropyl thio group), a substituted or unsubstituted $C_6$ to $C_{20}$ arylthio group (such as a phenylthio group, a 4-chlorophenylthio group), a substituted or unsubstituted $C_1$ to $C_{20}$ alkylsulfonyl group (such as a methyl sulfonyl group, an butyl sulfonyl group), a substituted or unsubstituted $C_6$ to $C_{20}$ arylsulfonyl group (such as a phenyl sulfonamide group, a p-tolyl sulfonamide group), a substituted or unsubstituted $C_1$ to $C_{17}$ carbamoyl group (such as an unsubstituted carbamoyl group, a methyl carbamoyl group, an ethyl carbamoyl group, an n-butyl carbamoyl group, a dimethyl carbamoyl group), a substituted or unsubstituted $C_1$ to $C_{16}$ acylamino group (such as an acetamino group, a benzamino group), a substituted or unsubstituted $C_2$ to $C_{20}$ acyloxy group (such as an acetoxy group, a benzoxy group), a substituted or unsubstituted $C_2$ to $C_{20}$ alkoxycarbonyl group (such as a methoxylcarbonyl group, an ethoxylcarbonyl group), a substituted or unsubstituted 5-membered or 6-membered heterocyclic group (such as an aromatic heterocyclic group of a pyridyl group, a thienyl group, a furyl group, a thiazolyl group, a imidazolyl group, a pyrazolyl group; or a non-aromatic heterocyclic group of a pyrrolidino group, a piperidino group, a morpholino group, a pyrano group, a thiopyrano group, a dioxano group, a dithiolane group).

Preferably, the substitutents represents by $R_{a1}$ to $R_{a8}$ and $R_{b1}$ to $R_{b8}$ are selected from the group consisting of a substituted or unsubstituted $C_1$ to $C_{16}$ linear or cyclic alkyl group, a substituted or unsubstituted $C_6$ to $C_{14}$ aryl group, a substituted or unsubstituted $C_1$ to $C_{16}$ alkoxyl group, a substituted or unsubstituted $C_6$ to $C_{14}$ aryloxy group, a halogen atom, a substituted or unsubstituted $C_2$ to $C_{17}$ alkoxycarbonyl group, a substituted or unsubstituted $C_1$ to $C_{10}$ carbamoyl group, and a substituted or unsubstituted $C_1$ to $C_{10}$ acylamino group.

More preferably, the substitutents represents by $R_{a1}$ to $R_{a8}$ and $R_{b1}$ to $R_{b8}$ are selected from the group consisting of a substituted or unsubstituted $C_1$ to $C_{10}$ linear or cyclic alkyl group, a substituted or unsubstituted $C_6$ to $C_{10}$ aryl group, a substituted or unsubstituted $C_1$ to $C_{10}$ alkoxyl group, a substituted or unsubstituted $C_6$ to $C_{10}$ aryloxy group, a choloride atom, a substituted or unsubstituted $C_2$ to $C_{11}$ alkoxycarbonyl group, a substituted or unsubstituted $C_1$ to $C_7$ carbamoyl group, and a substituted or unsubstituted $C_1$ to $C_8$ acylamino group.

Still more preferably, the substitutents represents by $R_{a1}$ to $R_{a8}$ and $R_{b1}$ to $R_{b8}$ are selected from the group consisting of an unsubstituted $C_1$ to $C_8$ linear or cyclic alkyl group, an unsubstituted $C_1$ to $C_8$ alkoxyl group, an unsubstituted $C_3$ to $C_9$ alkoxycarbonyl group, a chloride atom, and a phenyl. Most preferably, the substitutents represents by $R_{a1}$ to $R_{a8}$ and $R_{b1}$ to $R_{b8}$ are an unsubstituted $C_1$ to $C_6$ alkoxyl group.

The compound represented by the general formula (6) or (7) according to the invention can form a polymer in any position, and the units thereof can be the same or different, and can also bind to the polymer of polystyrene, polymethylacrylate, polyvinyl alcohol, or cellulose.

The aforementioned compound represented by the general formula (6) or (7) may be used alone or in combinations of two or more. Preferably, it is a combination of isomers having substituents in different positions.

In the preferred embodiment of the invention, the phthalocyanine dye (C-3) is represented by the following general formula (8), formula (9), formula (10), formula (11), or formula (12),

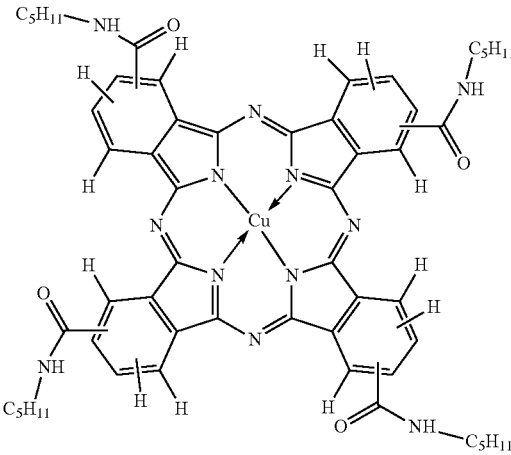

formula (8)

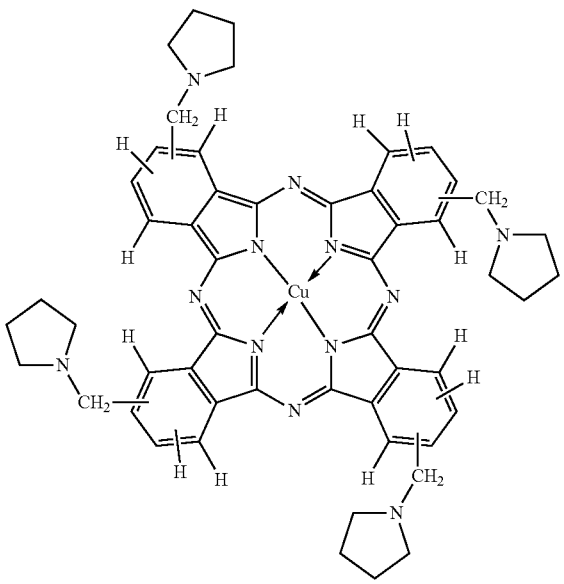

formula (9)

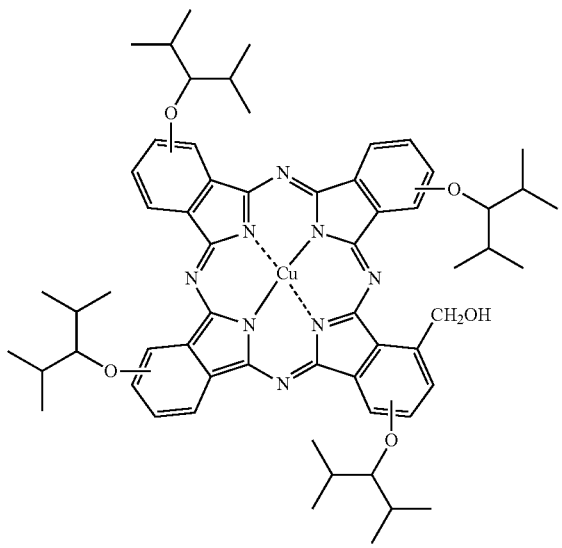

formula (10)

-continued

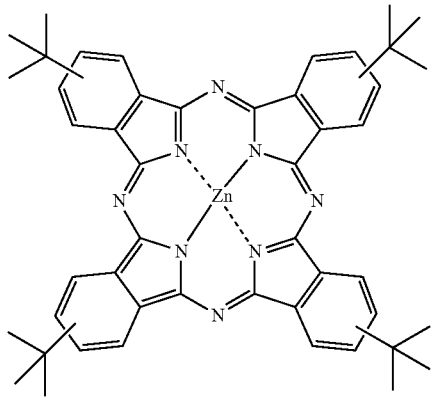

formula (11)

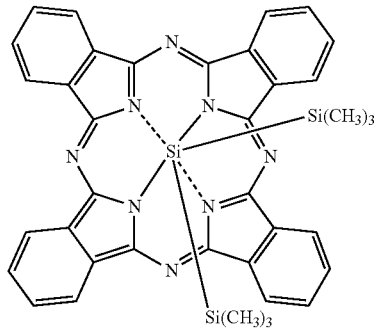

formula (12)

Several commercialized products of the phthalocyanine dye (C-3) are ready for chosen, such as C.I. Acid Blue 249, C.I. Solvent Blue 25, C.I. Solvent Blue 55, Solvent Blue 64 (trade name of Neptun Blue 698), Solvent Blue 67, C.I. Solvent Blue 70 (trade name of Neozapon Blue 807; manufactured by BASF), C.I. Direct Blue 199, C.I. Direct Blue 86 (trade name of Turquoise Blue; manufactured by Italia Incorporation).

If the phthalocyanine dye (C-3) is used, the resolution is further improved.

In one preferred embodiment of the invention, the positive photosensitive resin composition further comprises a perinone dye, a perylene dye, an azo dye, a methane dye, a quinoline dye, an azine dye, an anthraquinone dye, an indigo dye, an oxonol dye, a thiazine dye, an anthrapyridone dye, a xanthene dye or a benzopyran dye as needed.

In one preferred embodiment of the invention, the amount of the dye (C) used is from 5 to 120 parts by weight; preferably from 10 to 100 parts by weight; more preferably from 15 to 80 parts by weight based on 100 parts by weight of the novolac resin (A) used.

In one preferred embodiment of the invention, the amount of the dye (C-1) used is from 2 to 30 parts by weight; preferably from 3 to 15 parts by weight; more preferably from 5 to 10 parts by weight; the amount of the dye (C-2) used is from 1 to 10 parts by weight; preferably from 2 to 9 parts by weight; more preferably from 3 to 8 parts by weight; the amount of the dye (C-3) used is from 5 to 30 parts by weight; preferably from 7 to 28 parts by weight; more preferably from 10 to 25 parts by weight based on 100 parts by weight of the novolac resin (A) used.

In one embodiment of the invention, the ratio of the amount of the dye (C-1) used and the amount of the dye (C-2) used is from 1 to 10; preferably from 2 to 9; more preferably from 3 to 7. If the ratio of the amount of the dye (C-1) used and the amount of the dye (C-2) used is from 1 to 10, the color off after etching is avoided.

The solvent (D) as used herein refers to an organic solvent that is dissolved but not reacted with other organic components.

Specific examples of the solvent (D) include but are not limited to (poly)alkylene glycol monoalkyl ethers such as ethylene glycol monomethyl ether, ethylene glycol monoethyl ether, diethylene glycol monoethyl ether, diethylene glycol mono-n-propyl ether, diethylene glycol mono-n-butyl ether, trimethylene glycol monomethyl ether, triethylene glycol monoethyl ether, propylene glycol monomethyl ether, propylene glycol monoethyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, tripropylene glycol monoethyl ether and the like; (poly)alkylene glycol monoalkyl ether acetates such as ethylene glycol monomethyl ether acetate, ethylene glycol monoethyl ether acetate, propylene glycol monomethyl ether acetate, propylene glycol monoethyl ether acetate and the like; other ethers such as diethylene glycol dimethyl ether, diethylene glycol methyl ethyl ether, diethylene glycol diethyl ether, tetrahydrofuran and the like; ketones such as methyl ethyl ketone, cyclohexanone, 2-heptanone, 3-heptanone and the like; alkyl lactates such as methyl 2-hydroxypropanoate, ethyl 2-hydroxypropanoate(ethyl lactate) and the like; other esters such as methyl 2-hydroxy-2-methylpropanoate, ethyl 2-hydroxy-2-methylpropanoate, methyl 3-methoxypropanoate, ethyl 3-methoxypropanoate, methyl 3-ethoxypropanoate, ethyl 3-ethoxypropanoate, ethyl ethoxyacetate, ethyl hydroxyacetate, methyl 2-hydroxy-3-methylenebutyrate, 3-methyl-3-methoxybutyl acetate, 3-methyl-3-methoxybutyl propanoate, ethyl acetate, n-propyl acetate, isopropyl acetate, n-butyl acetate, isobutyl acetate, n-amyl acetate, isoamyl acetate, n-butyl propanoate, ethyl butyrate, n-propyl butyrate, isopropyl butyrate, n-butyl butyrate, methyl pyruvate, ethyl pyruvate, n-propyl pyruvate, methyl acetoacetate, ethyl acetoacetate, ethyl 2-oxybutyrate and the like; aromatic hydrocarbons such as toluene, xylene and the like; carboxylic amines such as N-methylpyrrolidone, N,N-dimethylformamide, N,N-dimethylacetamide and the like. The solvent (D) may be used alone or in combinations of two or more. Among those solvents, propylene glycol monoethyl ether, propylene glycol monomethyl ether acetate and ethyl lactate are preferred.

In one preferred embodiment of the invention, the amount of the solvent (D) used is from 500 to 2,000 parts by weight; preferably from 600 to 1,800 parts by weight; more preferably from 700 to 1,500 parts by weight based on 100 parts by weight of the novolac resin (A) used.

The positive photosensitive resin composition according to the invention preferably further includes an additive (E) that includes but is not limited to an adhesiveness improver, a surface-leveling agent, a diluent, a sensitizer and the like.

Examples of the adhesiveness improver include but are not limited to a melamine compound and a silane compound, thereby strengthening the adhesiveness of the positive photosensitive resin composition attached on the substrate. Specific examples of the melamine compound include but are not limited to the products available commercially as Cymel-300 and Cymel-303 (CYTEC Industries Inc., NJ, U.S.A); and MW-30MH, MW-30, MS-11, MS-001, MX-750 and MX-706 (Sanwa Chemical Co., Ltd, Japan). Specific examples of the silane compound, include but are not limited to vinyltrimethoxysilane, vinyltriethoxysilane, 3-acryloxypropyltrimethoxy silane, vinyl tris(2-methoxyethoxy)silane, N-(2-aminoethyl)-3-aminopropyl methyl dimethoxysilane, N-(2-aminoethyl)-3-aminopropyl trimethoxysilane, 3-aminopropyl triethoxysilane, 3-glycidoxypropyltrimetoxysilane, 3-glycidoxypropylmethyldimetoxysilane, 2-(3,4-epoxycyclohexyl)ethyltrimethoxysilane, 3-chloropropylmethyldimetoxysilane, 3-chloropropyltrimetoxysilane, 3-methacryloxy propyl trimethoxysilane, 3-mercapto propyltrimethoxysilane, bis(1, 2-trimethoxysilyl)ethane.

In one preferred embodiment of the invention, the amount of the melamine compound used is from 0 to 20 parts by weight; preferably from 0.5 to 18 parts by weight; more preferably from 1.0 to 15 parts by weight; the amount of the silane compound used is from 0 to 2 parts by weight; preferably from 0.001 to 1 parts by weight; more preferably from 0.005 to 0.8 parts by weight based on 100 parts by weight of the novolac resin (A) used for further improving the temporal stability.

Examples of the aforementioned surface-leveling agent include but are not limited to a fluorosurfactant and a silicon-based surfactant. Specific examples of the fluorosurfactant include but are not limited to the products available commercially as trade names of Fluorad FC-430 and FC-431 (manufactured by 3M Specialty Materials Division, MN, U.S.A); and trade names of F top EF122A, 122B, 122C, 126 and BL20 (manufactured by Tochem product Co., Ltd). Specific examples of the silicon-based surfactant include but are not limited to the products available commercially as trade names of SF8427 and SH29PA (Dow Corning Toray Silicone Co., Ltd).

In one preferred embodiment of the invention, the amount of the surfactant used is from 0 to 1.2 parts by weight; preferably from 0.025 to 1.0 parts by weight; more preferably from 0.050 to 0.8 parts by weight based on 100 parts by weight of the novolac resin (A) used for further improving the temporal stability.

Specific examples of the diluent include but are not limited to the products available commercially as trade names of RE801 and RE802 (manufactured by Teikoku Printing Inks Mfg. Co., Ltd. JP).

Specific examples of the sensitizer include but are not limited to the products available commercially as trade names of TPPA-1000P, TPPA-100-2C, TPPA-1100-3C, TPPA-1100-4C, TPPA-1200-24×, TPPA-1200-26×, TPPA-1300-235T, TPPA-1600-3M6C and TPPA-MF (manufactured by Honsyu Chemical Industry Ltd., JP). Among those sensitizers, TPPA-1600-3M6C and TPPA-MF are preferred. The aforementioned sensitizers may be used alone or in combinations of two or more.

In one preferred embodiment of the invention, the amount of the sensitizer used is from 0 to 20 parts by weight; preferably from 0.5 to 18 parts by weight; more preferably from 1.0 to 15 parts by weight based on 100 parts by weight of the novolac resin (A) used for further improving the temporal stability.

In addition, the positive photosensitive resin composition can be added with other additives such as plasticizer, stabilizer and so on if needed.

The method for the preparation of the positive photosensitive resin composition according to the invention can be carried out by artisans skilled in this field. In one embodiment of the invention, the positive photosensitive resin composition is prepared by mixing the novolac resin (A), the ortho-naphthoquinone diazide sulfonic acid ester (B), the dye (C) and the solvent (D) well in a mixer until all components are formed into a solution state. The positive photosensitive resin composition is optionally added with the additive (E) such as the adhesiveness improver, the surface-leveling agent, the diluent, the sensitizer and so on if needed.

The present invention also provides a method for manufacturing a thin-film transistor array substrate. The thin-film transistor array substrate comprises a substrate and a pattern. The method comprises coating the positive photosensitive resin composition as mentioned above on the substrate to form the pattern.

In one embodiment of the invention, the positive photosensitive resin composition of the present invention can be subjected to a prebake step, an exposure step, a development step and a postbake step, so as to forming patterns on a substrate.

Specifically, in the method for forming patterns by using the positive photosensitive resin composition, the resin composition is applied on the substrate by various coating methods, for example, spin coating, cast coating or roll coating methods. And then, the coated resin composition is prebaked to remove the solvent, thereby forming a prebaked coating film. The prebake step is carried out in various conditions, for example, at 70 to 110° C. for 1 to 15 minutes, which depend upon the kinds and the mixing ratio of components.

After the prebake step, the prebaked coating film is exposed under a given mask, and immersed in a developing solution at 23±2° C. for 15 seconds to 5 minutes, thereby removing undesired areas and forming a given pattern. The exposure light is preferably g-line, h-line, i-line and so on, which may be generated by a UV illumination device such as (super) high-pressure mercury lamp or metal halide lamp.

Specific examples of the developing solution include but are not limited to alkaline compounds such as sodium hydroxide, potassium hydroxide, sodium carbonate, sodium bicarbonate, potassium carbonate, potassium bicarbonate, sodium silicate, sodium methyl silicate, ammonia solution, ethylamine, diethylamine, dimethylethylanolamine, tetramethylammonium hydroxide, tetraethylammonium hydroxide, choline, pyrrole, piperidine, 1,8-diazabicyclo-[5,4,0]-7-undecene and the like.

The concentration of the developing solution is preferably 0.001 weight percent (wt %) to 10 wt %, more preferably 0.005 wt % to 5 wt %, and much more preferably 0.01 wt % to 1 wt %.

When the aforementioned alkaline compounds are included in the developing solution, the coating film can be washed by water after being developed, and then be dried by compressed air or nitrogen gas. Next, the coating film is postbaked by using a hot plate, an oven or other heating device. The postbake step can be carried out at 100 to 250° C. for 1 to 60 minutes on the hot plate for 5 to 90 minutes in the oven. After those steps, the pattern is formed on the substrate.

The present invention also provides a thin-film transistor array substrate manufactured according to the method as mentioned above.

In one embodiment of the invention, the positive photosensitive resin composition is applied on a substrate by various coating methods, for example, spin coating, cast coating or roll coating methods, for forming a positive photoresist layer, in which the aforementioned substrate is a glass or plastic substrate with a film of aluminum, chromium, silicon nitride or amorphous silicon formed thereon. Next, through the prebake, exposure, development and post bake steps for forming the photosensitive resin pattern, the pattern is etched and then the photoresist is stripped. Those steps are repeated for obtaining the TFT array substrate with one or more TFTs or electrodes disposed thereon.

Reference is made to FIG. 1, which depicts a partial cross-sectional diagram of a TFT array substrate for a LCD device according to an embodiment of the present invention. First of all, a gate 102a and a storage capacitance Cs electrode 102b are disposed on an aluminum film of a glass substrate 101. Next, a silicon oxide (SiO$_x$) film 103 or a silicon nitride (SiN$_x$) film 104 each of which functions as an insulation film is covered over the gate 102a. And then, an amorphous silicon (a-Si) film 105 that functions as a semiconductor active layer is formed on the insulation film. Next, another a-Si film 106 doped with nitrogen impurity is disposed on the a-Si film 105 for reducing the interface resistance. Later, a drain 107a and a source 107b are formed by using a metal such as aluminum or the like, in which the drain 107a is connected to a data signal line (unshown), and the source 107b is connected to the pixel electrode (or sub-pixel electrode) 109. Subsequently, another silicon nitride film is disposed which functions as a protection film 108 for protecting the a-Si film 105 (as the semiconductor active layer), the drain 107a or the source 107b.

The present invention also provides a liquid crystal display device comprising the thin-film transistor array substrate as mentioned above.

The In addition, the liquid crystal display device also includes other components if needed.

Specific examples of the liquid crystal display device basically include but are not limited to the following. (1) The aforementioned TFT array substrate (driver substrate) and a color filter (CF) substrate are disposed oppositely, spacers are disposed therebetween for forming a space, and LC material is sealed in the space, so as to assemble the LCD device. In such case, the TFT array substrate has driving components (including TFTs) and pixel electrodes (electrically conductive layer) arranged thereon, and the CF substrate is constituted by CF and a counter electrode (electrically conductive layer). Alternatively, (2) the aforementioned TFT array substrate is combined with the CF substrate for forming a one-piece CF-TFT array substrate, and the one-piece CF-TFT array substrate and a counter substrate with the counter electrode (electrically conductive layer) are disposed oppositely, spacers are disposed therebetween for forming a space, and the LC material is sealed in the space, so as to assemble the LCD device. The LC material can be any prior LC compound or composition without any limitation.

Specific examples of the aforementioned electrically conductive layer include but are not limited to indium tin oxide (ITO) film; a metal film such as aluminum, zinc, copper, iron, nickel, chromium, molybdenum or the like; and metal oxide film such as silicon dioxide or the like. Among those films, a transparent film is preferred, and the ITO film more preferred.

Specific examples of the aforementioned substrate used in the TFT array substrate, the CF substrate and the counter substrate include but are not limited to the prior glass such as Na—Ca glass, low-swelling glass, alkali-free glass, a quartz glass or the like. In addition, the aforementioned substrate may include a plastic substrate.

The following examples are given for the purpose of illustration only and are not intended to limit the scope of the present invention.

Example

The novolac resin (A) is synthesized according to Tables 1 and 2.

TABLE 1

| Synthesis Example | Component (Mole) | | | | | | | Poly-condensation | Area of the |
|---|---|---|---|---|---|---|---|---|---|
| | cresol | aromatic hydroxyl compound | | | aldehyde | Catalyst | | | |
| | o-cresol | m-cresol | p-cresol | 2,5-dimethyl-phenol | formal-dehyde | oxalic acid | Temp. (° C.) | time (hr) | cresol dimer (%) |
| A-1 | | 0.70 | 0.30 | | 0.65 | 0.020 | 100 | 6 | 10.4 |
| A-2 | 0.05 | 0.30 | 0.65 | | 0.80 | 0.015 | 95 | 6 | 8.1 |
| A-3 | | 0.35 | 0.60 | 0.05 | 0.70 | 0.020 | 100 | 6 | 9.5 |

TABLE 2

| Synthesis Example | Novolac resin | | | Good solvent | Poor solvent | | Times of wash | Area of the cresol dimer (%) |
|---|---|---|---|---|---|---|---|---|
| | A-1 | A-2 | A-3 | PGMEA | ethylbenzene | Isopropyl-benzene | | |
| A-4 | 100 | | | 300 | 2000 | | 1 | 6.0 |
| A-5 | 100 | | | 300 | | 3000 | 1 | 4.8 |
| A-6 | | 100 | | 300 | | 2000 | 2 | 3.3 |
| A-7 | | | 100 | 300 | 2000 | 1000 | 2 | 0.5 |

Method of Synthesizing Novolac Resin (A-1-1)

A 1000 mL four-necked conical flask equipped with a nitrogen inlet, a stirrer, a heater, a condenser and a thermometer was purged with nitrogen, and the components were charged to the flask according to Table 1. The aforementioned components comprising 0.7 mole of m-cresol, 0.3 mole of p-cresol, 0.65 mole of formaldehyde, and 0.02 mole of oxalic acid were stirred and the temperature of oil bath was elevated to 100° C. The reaction temperature of polycondensation was maintained at 100° C. for 6 hours. After completing the polycondensation and evaporating the solvent, the novolac resin (A-1) was obtained.

Methods of Synthesizing Novolac Resins (A-2) and (A-3)

The novolac resins (A-2) and (A-3) were prepared with the same method as that of the novolac resin (A-1) with the modifications of various kinds or usage of the cresol aromatic hydroxyl compound, aldehyde, catalyst, and temperature listed in Table 1.

Method of Synthesizing Novolac Resin (A-4)

One hundred parts by weight of the prepared novolac resin (A-1) was dissolved in the solvent of 300 parts by weight of propylene glycol monomethyl ether acetate and continuously stirred at room temperature until complete dissolution. Two thousand parts by weight of ethylbenzene were added while continuously stirring for 30 minutes. After removing the precipitate and devolatilizing the solvent, the novolac resin (A-4) was obtained.

Method of Synthesizing Novolac Resin (A-5)

One hundred parts by weight of the prepared novolac resin (A-1) was dissolved in the solvent of 300 parts by weight of propylene glycol monomethyl ether acetate and continuously stirred at room temperature until complete dissolution. Three thousand parts by weight of isopropylbenzene were added while continuously stirring for 30 minutes. After removing the precipitate and devolatilizing the solvent, the novolac resin (A-5) was obtained.

Method of Synthesizing Novolac Resin (A-6)

One hundred parts by weight of the prepared novolac resin (A-2) was dissolved in the solvent of 300 parts by weight of propylene glycol monomethyl ether acetate and continuously stirred at room temperature until complete dissolution. Two thousand parts by weight of isopropylbenzene were added while continuously stirring for 30 minutes. After removing the precipitate, devolatilizing the solvent, and repeating the dissolving, removing the precipitate, and devolatilizing the solvent, the novolac resin (A-6) was obtained.

Method of Synthesizing Novolac Resin (A-7)

One hundred parts by weight of the prepared novolac resin (A-3) was dissolved in the solvent of 300 parts by weight of propylene glycol monomethyl ether acetate and continuously stirred at room temperature until complete dissolution. Two thousand parts by weight of ethylbenzene and 1000 parts by weight of isopropylbenzene were added while continuously stirring for 30 minutes. After removing the precipitate, devolatilizing the solvent, and repeating the dissolving, removing the precipitate, and devolatilizing the solvent, the novolac resin (A-7) was obtained.

Area of the Cresol Dimer in the Novolac Resin (A)

The molecular weight of the novolac resin (A) is calculated from an integral molecular weight distribution curve obtained by plotting cumulative weight percentage versus molecular weight falling within a range between 200 and 150,000 measured by gel permeation chromatography; and the measurement condition for the gel permeation chromatography uses an apparatus of 717 plus which is manufactured by Waters®, columns of 79911GP-501, 79911GP-502, 79911GP-503, and 79911GP-504 which is manufactured by Agilent Technologies®, a detector of 2414 RI Detector which is manufactured by Waters®), a mobile phase of tetrahydrofuran, a flow rate of 1.0 ml/min, a injection volume of 100 μL, a measurement temperature of 40° C., a measurement period of 60 minutes, and a molecular weight standard of polystyrene.

The area of the cresol dimer in the novolac resin (A) is estimated based on 100% of the integral area of the molecular weight of the novolac resin (A) measured by the gel permeation chromatography.

The results are shown in Tables 1 and 2.

Method of Manufacturing Positive Photosensitive Resin Composition

The following examples are directed to the preparation of the positive photosensitive resin compositions according to Tables 3 and 4.

Example 1

As shown in Table 3, 100 parts by weight of the novolac resin (A-4), parts by weight of the ester of 2,3,4-trihydroxybenzophenone and 1,2-naphthoquinone diazide-5-sulfonic acid (average degree of esterfication of 85%, hereinafter referred as B-1) and 5 parts by weight of the ester of 2,3,4,4'-tetrahydroxybenzophenone and 1,2-naphthoquinone diazide-5-sulfonic acid (average degree of esterfication of 85%, hereinafter referred as B-2), 2 parts by weight of C.I. Solvent Black 3 (trade name of Sudan Black 141; manufactured by Chuo synthetic Chemical Co) (C-1-1), 1 part by weight of C.I. Acid Violet 17 (trade name of Coomassie Violet R200; made by Sigma) (C-2-1) were added into 1000 parts by weight of propylene glycol monomethyl ether acetate, all of which were stirred and mixed well in a shaking mixer, so as to form a positive photosensitive resin composition of Example 1.

Examples 2 to 9

Examples 2 to 13 and Comparative Examples 1 to 6 were prepared with the same method as in Example 1 by using various kinds or usage of the components listed in Tables 3 and 4.

TABLE 3

| Component | | Examples | | | | | | | | | | | | |
|---|---|---|---|---|---|---|---|---|---|---|---|---|---|---|
| | | 1 | 2 | 3 | 4 | 5 | 6 | 7 | 8 | 9 | 10 | 11 | 12 | 13 |
| novolac resin (A) (parts by weight) | A-1 | | | | | | | | | | | | | |
| | A-2 | | | | | | | | | | | | | |
| | A-3 | | | | | | | | | | | | | |
| | A-4 | 100 | | | | 70 | | | | | | 100 | | 50 |
| | A-5 | | 100 | | | 30 | | | | | 100 | | 50 | |
| | A-6 | | | 100 | | | 30 | 100 | | 100 | | | 50 | |
| | A-7 | | | | 100 | | 70 | | 100 | | | | | 50 |
| ortho-naphthoquinone diazide sulfonic acid ester (B) (parts by weight) | B-1 | 25 | 20 | 15 | 25 | 15 | 15 | 20 | 25 | 20 | 15 | 20 | 25 | 20 |
| | B-2 | 5 | | 5 | | | 5 | | | 5 | | | | |

TABLE 3-continued

| | Component | | Examples | | | | | | | | | | | | |
|---|---|---|---|---|---|---|---|---|---|---|---|---|---|---|---|
| | | | 1 | 2 | 3 | 4 | 5 | 6 | 7 | 8 | 9 | 10 | 11 | 12 | 13 |
| dye(C) (parts by weight) | disazo dye, anthraquinone dye, or trivalent chromium azo dye (C-1) | C-1-1 | 2 | | | 10 | | | | 12 | 5 | | | 7 | |
| | | C-1-2 | | 5 | | 5 | 25 | | 7 | | | 10 | | 8 | 2 |
| | | C-1-3 | | | 10 | | | 2 | | | | | 30 | | |
| | triarylmethane dye(C-2) | C-2-1 | 1 | | | 10 | | | 3 | 3 | | | | 10 | |
| | | C-2-2 | | 3 | | | 1 | 5 | 3 | | 2 | | 5 | | 1 |
| | | C-2-3 | | | 6 | | | 5 | | | | 7 | | | |
| | phthalocyanine dye(C-3) | C-3-1 | | | | | | | | | 3 | | 10 | | 5 |
| | | C-3-2 | | | | | | | | | | 10 | | 50 | |
| | | C-3-3 | | | | | | | | | | | 10 | | |
| solvent(D) (parts by weight) | | D-1 | 1000 | 500 | 500 | 1000 | 800 | 1000 | 500 | 500 | 800 | 600 | 1000 | 700 | 1500 |
| | | D-2 | | 500 | | | 200 | | | 500 | | 400 | 1000 | 300 | |
| | | D-3 | | | 500 | | | | | | | 200 | | | |
| additives(E) (parts by weight) | | E-1 | | | | 0.3 | | | | 1 | | | | | |
| | | E-2 | | | | | | 2 | | | | | | 1 | |
| assays | | Area of cresol dimer (%) | 6.0 | 4.8 | 3.3 | 0.5 | 5.2 | 1.8 | 3.3 | 0.5 | 3.3 | 4.8 | 6.0 | 3.6 | 3.3 |
| | | C-1/C-2 | 2.0 | 1.7 | 1.7 | 1.5 | 25.0 | 0.2 | 1.2 | 4.0 | 2.5 | 1.4 | 6.0 | 1.5 | 2.0 |
| | | Color off after etching | ◎ | ◎ | ◎ | ◎ | ○ | ○ | ◎ | ◎ | ◎ | ◎ | ◎ | ◎ | ◎ |
| | | Resolution | ○ | ○ | ○ | ○ | ○ | ○ | ○ | ○ | ◎ | ◎ | ◎ | ◎ | ◎ |
| | | film remaining rate | ○ | ○ | ○ | ○ | ○ | ○ | ○ | ○ | ○ | ○ | ○ | ○ | ○ |

B-1 ester of 2,3,4-trihydroxybenzophenone and 1,2-naphthoquinone diazide-5-sulfonic acid
B-2 ester of 2,3,4,4'-tetrahydroxybenzophenone and 1,2-naphthoquinone diazide-5-sulfonic acid
C-1-1 C.I. Solvent Black 3 (Sudan Black 141; manufactured by Chuo synthetic Chemical Co)
C-1-2 C.I. Solvent Black 34 (VALIFAST BLACK 3804; manufactured by ORIENT CHEMICALS)
C-1-3 C.I. Solvent Black 27 (Neozapon Black X51; manufactured by BASF)
C-2-1 C.I. Acid Violet 17 (Coomassie Violet R200; manufactured by Sigma)
C-2-2 C.I. Basic Blue 7 (Basonyl Blau 636; manufactured by BASF)
C-2-3 C.I. Acid Blue 83 (Brilliant Blue R; manufactured by Trust Chem)
C-3-1 C.I. Direct Blue 86 (Turquoise Blue; manufactured by Italia Incorporation)
C-3-2 C.I. Solvent Blue 70 (Neozapon Blue 807; manufactured by BASF)
C-3-3 C.I. Solvent Blue 64 (Neptun Blue 698; manufactured by BASF)
D-1 propylene glycol monomethyl ether acetate (PGMEA)
D-2 ethyl lactate(EL)
D-3 propylene glycol monoethyl ether (PGEE)
E-1 Surfactant: F8427; manufactured by Toray Dow Corning Silicone
E-2 adhesiveness improver: Cymel-303; manufactured by CYTEC

TABLE 4

| | Component | | Comparative Examples | | | | | |
|---|---|---|---|---|---|---|---|---|
| | | | 1 | 2 | 3 | 4 | 5 | 6 |
| novolac resin (A) (parts by weight) | | A-1 | 100 | | | | | |
| | | A-2 | | 100 | | | | 100 |
| | | A-3 | | | | | 100 | |
| | | A-4 | | | 100 | | | |
| | | A-5 | | | | 100 | | |
| | | A-6 | | | | | | |
| | | A-7 | | | | | | |
| ortho-naphthoquinone diazide sulfonic acid ester (B) (parts by weight) | | B-1 | 25 | 20 | 15 | 20 | 25 | 20 |
| | | B-2 | | 5 | 10 | | | |
| dye(C) (parts by weight) | disazo dye, anthraquinone dye, or trivalent chromium azo dye (C-1) | C-1-1 | 10 | | | 10 | | |
| | | C-1-2 | | 5 | | | 10 | |
| | | C-1-3 | | | | | | |
| | triarylmethane dye(C-2) | C-2-1 | 5 | | | | 5 | |
| | | C-2-2 | | 10 | | | | |
| | | C-2-3 | | | 5 | | | |
| | phthalocyanine dye(C-3) | C-3-1 | | | | | | |
| | | C-3-2 | | | | | | |
| | | C-3-3 | | | | | | |
| solvent(D) (parts by weight) | | D-1 | 1000 | | 1000 | | | |
| | | D-2 | | 1000 | | | 1000 | |
| | | D-3 | | | | 1000 | | 1000 |

TABLE 4-continued

|  |  | Comparative Examples | | | | | |
| --- | --- | --- | --- | --- | --- | --- | --- |
| Component | | 1 | 2 | 3 | 4 | 5 | 6 |
| additives(E) | E-1 | | | | | | |
| (parts by weight) | E-2 | | | | | | |
| assays | Area of cresol dimer (%) | 10.4 | 8.1 | 6.0 | 4.8 | 9.5 | 8.1 |
| | C-1/C-2 | 2.0 | 0.5 | 0.0 | — | — | 0.0 |
| | Color off after etching | X | X | ○ | ○ | X | X |
| | Resolution | X | X | X | X | X | X |
| | film remaining rate | ○ | ○ | X | X | X | X |

B-1 ester of 2,3,4-trihydroxybenzophenone and 1,2-naphthoquinone diazide-5-sulfonic acid
B-2 ester of 2,3,4,4'-tetrahydroxybenzophenone and 1,2-naphthoquinone diazide-5-sulfonic acid
C-1-1 C.I. Solvent Black 3 (Sudan Black 141; manufactured by Chuo synthetic Chemical Co)
C-1-2 C.I. Solvent Black 34 (VALIFAST BLACK 3804; manufactured by ORIENT CHEMICALS)
C-1-3 C.I. Solvent Black 27 (Neozapon Black X51; manufactured by BASF)
C-2-1 C.I. Acid Violet 17 (Coomassie Violet R200; manufactured by Sigma)
C-2-2 C.I. Basic Blue 7 (Basonyl Blau 636; manufactured by BASF)
C-2-3 C.I. Acid Blue 83 (Brilliant Blue R; manufactured by Trust Chem)
C-3-1 C.I. Direct Blue 86 (Turquoise Blue; manufactured by Italia Incorporation)
C-3-2 C.I. Solvent Blue 70 (Neozapon Blue 807; manufactured by BASF)
C-3-3 C.I. Solvent Blue 64 (Neptun Blue 698; manufactured by BASF)
D-1 propylene glycol monomethyl ether acetate (PGMEA)
D-2 ethyl lactate(EL)
D-3 propylene glycol monoethyl ether (PGEE)
E-1 Surfactant: F8427; manufactured by Toray Dow Corning Silicone
E-2 adhesiveness improver: Cymel-303; manufactured by CYTEC Assays
Color Off after Etching The positive photosensitive resin composition of Examples and Comparative Examples were spin-coated on a glass substrate, and the composition was pre-baked at 110° C. for 160 seconds to obtain an 1.5 μm of pre-baked coating film. The pre-backed coating film was subjected to a designed photoresist and irradiated with 300 mJ/cm² of ultraviolet irradiation (Exposure Model AG500-4N; M & R Nano Technology system), and then developed at 23° C. for 1 minute with 2.38% of tetramethylammonium hydroxide (TMAH) solution, and then washed with pure water. The substrate was post-backed at 220° C. for 40 minutes, and etched by aluminate at 30° C. to obtain the glass substrate with pattern. The exposure time (optimal exposure time) Eop1 of forming the 1:1 line can be obtained. The transmittance spectrum (spectrum wavelength ranges of 400 nm to 780 nm) of the glass substrate with pattern was estimated by the transmittance rate measurement instrument (NCPD-300; manufactured by Otsuka Science and Technology Co., Ltd.). The transmittance spectrum of the glass substrate without pattern was taken as the base value, and the transmittance rate was estimated and ranging from 0% to 100%.

◎: transmittance rate≤15%
○: 15%<transmittance rate≤40%
x: 40%<transmittance rate Resolution The positive photosensitive resin composition of Examples and Comparative Examples were spin-coated on a glass substrate, and the composition was pre-baked at 110° C. for 160 seconds to obtain an 1.5 μm of pre-baked coating film. The pre-backed coating film was subjected to a line and space mask (Japan Filcon system, 1L/1S), and irradiated with different energy ultraviolet irradiation (Exposure Model AG500-4N; M & R Nano Technology system), and then developed for 1 minute at 23° C. with 2.38% of tetramethylammonium hydroxide solution. The exposed parts of the coating film on the substrate was removed, and then washed with pure water. The minimum amplitude of the formed line was taken as the resolution.

◎: amplitude of the formed line<2 μm
○: 2 μm≤amplitude of the formed line<3 μm
Δ: 3 μm≤amplitude of the formed line<5 μm
x: amplitude of the formed line≥5 μm Film Remaining Rate The thickness ($\delta_{d1}$) of the film of a random point in the pre-baked coating film as described in the aforementioned assay of "Resolution" was assayed, and the substrate was developed for 1 minute at 23° C. with 2.38% of tetramethylammonium hydroxide solution, and the thickness ($\delta_{d2}$) of the film of another random point was assayed. Finally, the film remaining rate was obtained by the following formula.

film remaining rate (%)=[($\delta_{d2}$)/$\delta_{d1}$)]×100

◎: film remaining rate>95%
○: 95%>film remaining rate>90%
Δ: 90%>film remaining rate>85%
x: film remaining rate≤85%

The results are shown in Tables 3 and 4. Compared to those of the Comparative Examples, the photosensitive resin composition according to the invention is without color off and the resolution and the film remaining rate are both good.

While embodiments of the present invention have been illustrated and described, various modifications and improvements can be made by persons skilled in the art. It is intended that the present invention is not limited to the particular forms as illustrated, and that all modifications not departing from the spirit and scope of the present invention are within the scope as defined in the following claims.

What is claimed is:

1. A positive photosensitive resin composition comprising:
a novolac resin (A);
an ortho-naphthoquinone diazide sulfonic acid ester (B);
a dye (C); and
a solvent (D);

wherein the novolac resin (A) is obtained by polycondensing a cresol aromatic hydroxyl compound with an aldehyde; based on 100% of the integral area of the molecular weight of the novolac resin (A) measured by the gel permeation chromatography, the area of the cresol dimer in the novolac resin (A) ranges from 0.5% to 6%; the dye (C) comprises a dye (C-1) and a dye (C-2), and the dye (C-1) is selected from the group consisting of a disazo dye, an anthraquinone dye, and a trivalent chromium azo dye; and the dye (C-2) is a triarylmethane dye;

wherein the amount of the dye (C) used is from 10 to 100 parts by weight; the amount of the dye (C-1) used is from 3 to 15 parts by weight; and the amount of the dye (C-2) used is from 2 to 9 parts by weight based on 100 parts by weight of the novolac resin (A) used;

wherein the ratio of the amount of the dye (C-1) used and the amount of the dye (C-2) used is from 1 to 10.

2. The positive photosensitive resin composition according to claim 1, wherein the molecular weight of the novolac resin (A) is calculated from an integral molecular weight distribution curve obtained by plotting cumulative weight percentage versus molecular weight falling within a range between 200 and 150,000 measured by gel permeation chromatography; and the measurement condition for the gel permeation chromatography uses an apparatus of 717 plus which is manufactured by Waters®, columns of 79911GP-501, 79911GP-502, 79911GP-503, and 79911GP-504 which is manufactured by Agilent Technologies®, a detector of 2414 RI Detector which is manufactured by Waters®, a mobile phase of tetrahydrofuran, a flow rate of 1.0 ml/min, a injection volume of 100 μL, a measurement temperature of 40° C., a measurement period of 60 minutes, and a molecular weight standard of polystyrene.

3. The positive photosensitive resin composition according to claim 1, wherein the amount of the ortho-naphthoquinone diazide sulfonic acid ester (B) used is from 5 to 50 parts, and the amount of the solvent (D) used is from 500 to 2000 parts by weight based on 100 parts by weight of the novolac resin (A) used.

4. The positive photosensitive resin composition according to claim 1, wherein the dye (C-2) has a structure represented by the following general formula (1) or formula (2) or a salt thereof,

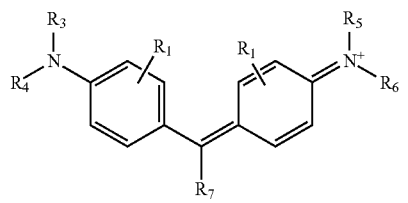

formula (1)

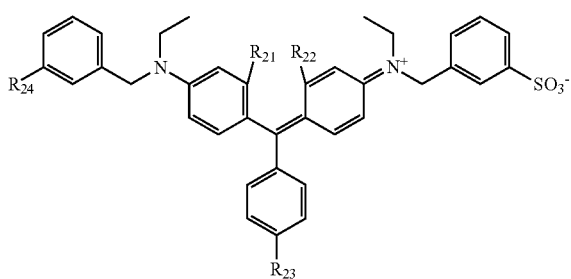

formula (2)

wherein in formula (1), $R_1$ and $R_2$ are independently selected from the group consisting of a hydrogen atom, a halogen atom and a $C_1$ to $C_5$ alkyl group;

$R_3$, $R_4$, $R_5$, and $R_6$ are independently selected from the group consisting of a hydrogen atom, a $C_1$ to $C_5$ alkyl group, a phenyl group and a benzyl group; and $R_7$ is selected from the group consisting of the general formula (3), formula (4) and formula (5),

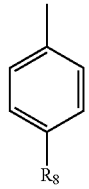

formula (3)

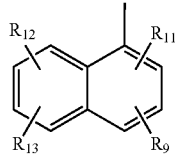

formula (4)

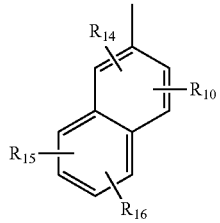

formula (5)

wherein:

$R_8$ to $R_{10}$ are selected from the group consisting of a hydrogen atom and $-NR_{25}R_{26}$;

wherein:

$R_{25}$ and $R_{26}$ are independently selected from the group consisting of a hydrogen atom, a $C_1$ to $C_5$ alkyl group, a benzyl group, a phenyl group, and a phenyl group substituted by a $C_1$ to $C_3$ alkoxy group or by a $C_1$ to $C_3$ alkyl group in the para position; and $R_{11}$ to $R_{16}$ are independently selected from the group consisting of a hydrogen atom, a hydroxyl group and $-SO^{3-}$;

wherein in formula (2), $R_{21}$ and $R_{22}$ are independently selected from the group consisting of a hydrogen atom, a halogen atom, and a $C_1$ to $C_5$ alkyl group; and $R_{23}$ is selected from the group consisting of a hydrogen atom, $-SO^{3-}$, a carboxyl group, a $C_1$ to $C_3$ alkyl group, a $C_1$ to $C_5$ alkoxyl group, and $-NR_{25}R_{26}$; and $R_{24}$ is selected from the group consisting of a hydrogen atom and $-SO^{3-}$.

5. The positive photosensitive resin composition according to claim 1, wherein the dye (C) further comprises a dye (C-3), and the dye (C-3) is a phthalocyanine dye.

6. The positive photosensitive resin composition according to claim 5, wherein the phthalocyanine dye (C-3) is represented by the following general formula (6), formula (6)

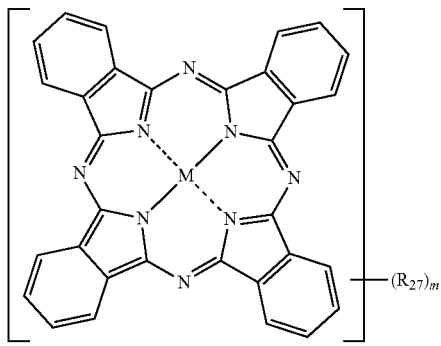

wherein:
each of $R_{27}$ independently represents a hydrogen atom, a halogen atom, a cyano group, a nitro group, a formyl group, a carboxyl group, a sulfo group, a substituted or unsubstituted $C_1$ to $C_{20}$ alkyl group, a substituted or unsubstituted $C_6$ to $C_{14}$ aryl group, a substituted or unsubstituted $C_1$ to $C_{10}$ heterocyclic group, a substituted or unsubstituted $C_1$ to $C_{20}$ alkoxy group, a substituted or unsubstituted $C_6$ to $C_{14}$ aryloxy group, a substituted or unsubstituted $C_2$ to $C_{21}$ acyl group, a substituted or unsubstituted $C_1$ to $C_{20}$ alkylsulfonyl group, a substituted or unsubstituted $C_6$ to $C_{14}$ arylsulfonyl group, a substituted or unsubstituted $C_1$ to $C_{10}$ heterysulfonyl group, a substituted or unsubstituted $C_1$ to $C_{25}$ carbamoyl group, a substituted or unsubstituted $C_0$ to $C_{32}$ sulfamoyl group, a substituted or unsubstituted $C_2$ to $C_{20}$ alkoxycarbonyl group, a substituted or unsubstituted $C_7$ to $C_{15}$ aryloxycarbonyl group, a substituted or unsubstituted $C_2$ to $C_{21}$ acylamino group, a substituted or unsubstituted $C_1$ to $C_{20}$ sulfonylamino group, and a substituted or unsubstituted $C_0$ to $C_{36}$ amino group;
n represents an integer of 1 to 8; and
M is selected from the group consisting of a metal, a metal chloride, a metal oxide and a metal hydroxide.

7. The positive photosensitive resin composition according to claim 6, wherein the amount of the dye (C-3) used is from 3 to 50 parts by weight based on 100 parts by weight of the novolac resin (A) used.

8. A method for manufacturing a thin-film transistor array substrate, wherein the thin-film transistor array substrate comprises a substrate and a pattern, the method comprising coating the positive photosensitive resin composition according to claim 1 on the substrate to form the pattern; exposing the pattern; and developing the exposed pattern.

9. The method according to claim 8, wherein the molecular weight of the novolac resin (A) is calculated from an integral molecular weight distribution curve obtained by plotting cumulative weight percentage versus molecular weight falling within a range between 200 and 150,000 measured by gel permeation chromatography; and the measurement condition for the gel permeation chromatography uses an apparatus of 717 plus (manufactured by Waters®), columns of 79911GP-501, 79911GP-502, 79911GP-503, and 79911GP-504 (manufactured by Agilent Technologies®), a detector of 2414 RI Detector (manufactured by Waters®), a mobile phase of tetrahydrofuran, a flow rate of 1.0 ml/min, a injection volume of 100 µL, a measurement temperature of 40° C., a measurement period of 60 minutes, and a molecular weight standard of polystyrene.

10. The method according to claim 8, wherein the amount of the ortho-naphthoquinone diazide sulfonic acid ester (B) used is from 5 to 50 parts, the amount of the dye (C) used is from 5 to 120 parts, the amount of the dye (C-1) used is from 2 to 30 parts by weight, the amount of the dye (C-2) used is from 1 to 10 parts, and the amount of the solvent (D) used is from 500 to 2000 parts by weight based on 100 parts by weight of the novolac resin (A) used.

11. The method according to claim 8, wherein the dye (C-2) has a structure represented by the following general formula (1) or formula (2) or a salt thereof, formula (1)

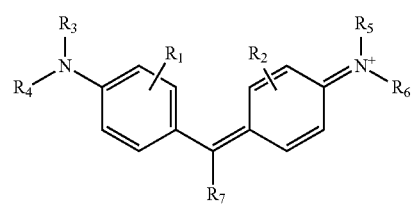

formula (2)

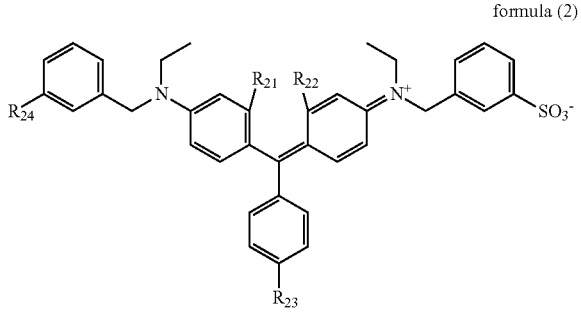

wherein in formula (1), $R_1$ and $R_2$ are independently selected from the group consisting of a hydrogen atom, a halogen atom and a $C_1$ to $C_5$ alkyl group;

$R_3$, $R_4$, $R_5$, and $R_6$ are independently selected from the group consisting of a hydrogen atom, a $C_1$ to $C_5$ alkyl group, a phenyl group and a benzyl group; and $R_7$ is selected from the group consisting of the general formula (3), formula (4) and formula (5), formula (3)

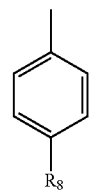

formula (4)

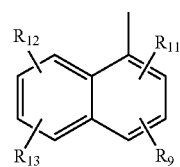

formula (5)

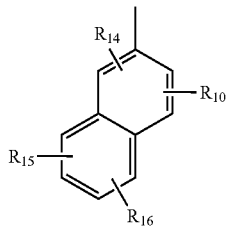

wherein:

$R_8$ to $R_{10}$ are selected from the group consisting of a hydrogen atom and —$NR_{25}R_{26}$;

wherein:

$R_{25}$ and $R_{26}$ are independently selected from the group consisting of a hydrogen atom, a $C_1$ to $C_5$ alkyl group, a benzyl group, a phenyl group, and a phenyl group substituted by a $C_1$ to $C_3$ alkoxy group or by a $C_1$ to $C_3$ alkyl group in the para position; and $R_{11}$ to $R_{16}$ are independently selected from the group consisting of a hydrogen atom, a hydroxyl group and —$SO^{3-}$;

wherein in formula (2), $R_{21}$ and $R_{22}$ are independently selected from the group consisting of a hydrogen atom, a halogen atom, and a $C_1$ to $C_5$ alkyl group; and $R_{23}$ is selected from the group consisting of a hydrogen atom, —$SO^{3-}$, a carboxyl group, a $C_1$ to $C_3$ alkyl group, a $C_1$ to $C_5$ alkoxyl group, and —$NR_{25}R_{26}$; and $R_{24}$ is selected from the group consisting of a hydrogen atom and —$SO^{3-}$.

12. The method according to claim 8, wherein the ratio of the amount of the dye (C-1) used and the amount of the dye (C-2) used is from 1 to 10.

13. The method according to claim 8, wherein the dye (C) further comprises a dye (C-3), and the dye (C-3) is a phthalocyanine dye.

14. The method according to claim 13, wherein the phthalocyanine dye (C-3) is represented by the following general formula (6), formula (6)

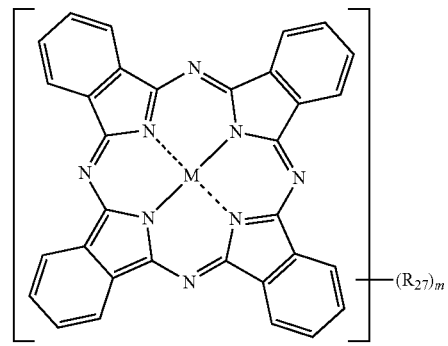

wherein:

each of $R_{27}$ independently represents a hydrogen atom, a halogen atom, a cyano group, a nitro group, a formyl group, a carboxyl group, a sulfo group, a substituted or unsubstituted $C_1$ to $C_{20}$ alkyl group, a substituted or unsubstituted $C_6$ to $C_{14}$ aryl group, a substituted or unsubstituted $C_1$ to $C_{10}$ heterocyclic group, a substituted or unsubstituted $C_1$ to $C_{20}$ alkoxy group, a substituted or unsubstituted $C_6$ to $C_{14}$ aryloxy group, a substituted or unsubstituted $C_2$ to $C_{21}$ acyl group, a substituted or unsubstituted $C_1$ to $C_{20}$ alkylsulfonyl group, a substituted or unsubstituted $C_6$ to $C_{14}$ arylsulfonyl group, a substituted or unsubstituted $C_1$ to $C_{10}$ heterysulfonyl group, a substituted or unsubstituted $C_1$ to $C_{25}$ carbamoyl group, a substituted or unsubstituted $C_0$ to $C_{32}$ sulfamoyl group, a substituted or unsubstituted $C_2$ to $C_{20}$ alkoxycarbonyl group, a substituted or unsubstituted $C_7$ to $C_{15}$ aryloxycarbonyl group, a substituted or unsubstituted $C_2$ to $C_{21}$ acylamino group, a substituted or unsubstituted $C_1$ to $C_{20}$ sulfonylamino group, and a substituted or unsubstituted $C_0$ to $C_{36}$ amino group;

m represents an integer of 1 to 8; and

M is selected from the group consisting of a metal, a metal chloride, a metal oxide and a metal hydroxide.

15. The method according to claim 14, wherein the amount of the dye (C-3) used is from 3 to 50 parts by weight based on 100 parts by weight of the novolac resin (A) used.

16. A thin-film transistor array substrate manufactured according to the method according to claim 8.

17. A liquid crystal display device comprising the thin-film transistor array substrate according to claim 16.

\* \* \* \* \*